US012677676B2

(12) United States Patent
Naito et al.

(10) Patent No.: US 12,677,676 B2
(45) Date of Patent: Jul. 7, 2026

(54) METHOD FOR PRODUCING A PACKAGE SUBSTRATE INCLUDING A COMPOSITION FOR REMOVING THE PHOTORESIST

(71) Applicants: MITSUBISHI GAS CHEMICAL COMPANY, INC., Chiyoda-ku (JP); Mitsubishi Gas Chemical Trading, Inc., Chiyoda-ku (JP)

(72) Inventors: Yukihide Naito, Tokyo (JP); Kensuke Ohmae, Tokyo (JP); Hiroshi Matsunaga, Kanagawa (JP); Satoshi Tamai, Kanagawa (JP)

(73) Assignees: MITSUBISHI GAS CHEMICAL COMPANY, INC., Chiyoda-ku (JP); Mitsubishi Gas Chemical Trading, Inc., Chiyoda-ku (JP)

( * ) Notice: Subject to any disclaimer, the term of this patent is extended or adjusted under 35 U.S.C. 154(b) by 457 days.

(21) Appl. No.: 17/630,383

(22) PCT Filed: Jul. 29, 2020

(86) PCT No.: PCT/JP2020/028957
§ 371 (c)(1),
(2) Date: Jan. 26, 2022

(87) PCT Pub. No.: WO2021/020410
PCT Pub. Date: Feb. 4, 2021

(65) Prior Publication Data
US 2022/0285172 A1      Sep. 8, 2022

(30) Foreign Application Priority Data

Jul. 30, 2019      (JP) ................................ 2019-139940

(51) Int. Cl.
*H10W 70/05*      (2026.01)
*G03F 7/42*      (2006.01)
(Continued)

(52) U.S. Cl.
CPC .......... *H10W 70/097* (2026.01); *G03F 7/425* (2013.01); *H10W 72/01204* (2026.01); *H10W 72/07236* (2026.01); *H10W 72/252* (2026.01)

(58) Field of Classification Search
CPC ............. H01L 21/4864; H01L 21/4846; H01L 21/027; H01L 21/288; H01L 21/31133;
(Continued)

(56) References Cited

U.S. PATENT DOCUMENTS 6,440,326 B1      8/2002  Maruyama et al.
8,043,484 B1 *  10/2011  Rozbicki .......... H01L 21/76805
                                                              438/424
(Continued)

FOREIGN PATENT DOCUMENTS

CN      102298277 A      12/2011
CN      104342701 A      2/2015
(Continued)

OTHER PUBLICATIONS

Japanese Office Action issued Feb. 27, 2024 in Japanese Patent Application No. 2021-535369 (with unedited computer-generated English translation), 9 pages.
(Continued)

*Primary Examiner* — Wael M Fahmy
*Assistant Examiner* — Tiberiu Dan Onuta
(74) *Attorney, Agent, or Firm* — Oblon, McClelland, Maier & Neustadt, L.L.P.

(57) ABSTRACT

The present invention provides: an aqueous composition capable of removing a photoresist from a printed wiring board or a semiconductor wafer while preventing corrosion of tin plating and tin alloy plating in addition to a copper wiring; and a method for removing a photoresist using the aqueous composition. The aqueous composition according to the present invention is characterized by comprising an
(Continued)

alkanolamine (A), a quaternary ammonium hydroxide (B), a sugar alcohol (C), a polar organic solvent (D), and water (E), wherein, with respect to the total amount of the composition, the content of the alkanolamine (A) is 2.5-50 mass %, the content of the quaternary ammonium hydroxide (B) is 0.5-4 mass %, and the content of the sugar alcohol (C) is 0.5-20 mass %.

16 Claims, 3 Drawing Sheets

(51) Int. Cl.
    *H10W 72/00*        (2026.01)
    *H10W 72/20*        (2026.01)

(58) Field of Classification Search
    CPC ......... H01L 24/11; H01L 24/81; H01L 24/13; H01L 24/80; H01L 2224/11001; H01L 2224/13111; H01L 2224/13147; H01L 2224/81801; H01L 2224/1146; H01L 2224/1147; H01L 2224/13082; H01L 2224/81192; H01L 2224/81815; H01L 23/14; G03F 7/425; G03F 7/343; H05K 3/18; H05K 3/184; H05K 1/09
    See application file for complete search history.

(56) References Cited

U.S. PATENT DOCUMENTS

| | | | | |
|---|---|---|---|---|
| 8,302,298 | B2 * | 11/2012 | Kung | H05K 3/4007 |
| | | | | 29/829 |
| 2004/0084061 | A1 | 5/2004 | Takashima | |
| 2005/0029110 | A1 * | 2/2005 | Tang | H05K 3/4647 |
| | | | | 205/125 |
| 2009/0082240 | A1 * | 3/2009 | Nukui | G03F 7/425 |
| | | | | 510/176 |
| 2010/0155116 | A1 * | 6/2010 | Kawai | H05K 1/112 |
| | | | | 174/257 |
| 2014/0346672 | A1 * | 11/2014 | Lin | H01L 23/48 |
| | | | | 257/737 |
| 2015/0034590 | A1 | 2/2015 | Takahashi et al. | |
| 2020/0203151 | A1 * | 6/2020 | Yoo | H10P 76/204 |
| 2020/0365543 | A1 * | 11/2020 | Shah | H01L 24/13 |
| 2025/0029110 | A1 * | 1/2025 | Wooters | G06Q 30/015 |

FOREIGN PATENT DOCUMENTS

| | | | | | |
|---|---|---|---|---|---|
| EP | | 0723205 | A1 * | 7/1996 | ............ H10P 70/273 |
| EP | | 0723205 | B1 * | 5/2002 | ............ H10P 70/273 |
| JP | | 8-262746 | A | 10/1996 | |
| JP | H | 08262746 | * | 10/1996 | .......... H01L 21/027 |
| JP | | 9-319098 | A | 12/1997 | |
| JP | | 0723205 | B1 * | 5/2002 | .......... H01L 21/027 |
| JP | | 2003-122029 | A | 4/2003 | |
| JP | | 2003-255565 | A | 9/2003 | |
| JP | | 2004-38073 | A | 2/2004 | |
| JP | | 2004-134783 | A | 4/2004 | |
| JP | | 2009-115929 | A | 5/2009 | |
| JP | | 2015-46575 | A | 3/2015 | |
| JP | | 2019-113848 | A | 7/2019 | |
| KR | 10-2017-0100974 | | A | 9/2017 | |

OTHER PUBLICATIONS

Taiwanese Office Action issued Mar. 11, 2024 in Taiwanese Patent Application No. 109125482, 5 pages.

International Search Report mailed on Oct. 20, 2020 in PCT/JP2020/028957 filed on Jul. 29, 2020, 2 pages).

Combined Chinese Office Action and Search Report issued Aug. 30, 2024, in corresponding Chinese Patent Application No. 202080054482.2 (with English Translation of Category of Cited Documents), 10 pages.

* cited by examiner

METHOD FOR PRODUCING A PACKAGE SUBSTRATE INCLUDING A COMPOSITION FOR REMOVING THE PHOTORESIST

CROSS-REFERENCE TO RELATED APPLICATIONS

The present application is a 35 U.S.C. § 371 national stage application of International patent application PCT/JP2020/028957, filed Jul. 29, 2020, which is based on and claims the benefit of priority to Japanese Application No. 2019-139940, filed Jul. 30, 2019. The entire contents of these applications are incorporated herein by reference.

TECHNICAL FIELD

The present invention relates to a composition for removing a photoresist after forming a circuit pattern, wherein the photoresist is for forming the circuit pattern on an insulation layer at least partially having a copper wiring, wherein the circuit pattern constitutes a connecting terminal portion of the copper wiring and comprises copper and at least one selected from the group consisting of tin and a tin alloy, and a method for removing the photoresist using the composition. Further, the present invention relates to methods for producing a package substrate for mounting semiconductor devices, a semiconductor device and a semiconductor package, which comprise a step of removing a photoresist using the composition.

BACKGROUND ART

Recently, with size reduction, weight reduction and sophistication of electronic devices, microminiaturization and density increase of copper wirings have been strongly desired for printed wiring boards.

In the process of producing a printed wiring board, a metal layer called "seed layer" is formed on an insulation layer partially having a copper wiring, a photoresist layer is formed on the surface thereof, exposure and development are performed to form a resist pattern, then a copper plating is provided to an opening of the pattern, and then the photoresist and the seed layer are removed, thereby forming a circuit pattern which constitutes a connecting terminal portion of the copper wiring.

As a photoresist, a dry film resist is often used, and usually, an aqueous solution of an inorganic alkali such as sodium hydroxide and potassium hydroxide is used to remove the photoresist from a substrate. Further, for a printed wiring board having a fine wiring, wherein the degree of difficulty in wiring formation is higher, such as a package substrate for mounting semiconductor devices, an amine aqueous solution, for example, a photoresist stripping solution obtained by combining amine, a quaternary ammonium salt, a polar solvent, an anticorrosive for copper, etc. is used to remove a photoresist from a substrate (Patent Literature 1, etc.).

Conventionally, for electrically connecting a component such as a semiconductor device to a printed wiring board (e.g., a package substrate for mounting semiconductor devices), a solder ball has been used for a connecting terminal portion of a copper wiring, but recently, with size reduction in components and density increase of wirings, there have been moves to replace a solder ball with a tin plating or a tin alloy plating.

CITATION LISTS

Patent Literatures

Patent Literature 1: Japanese Laid-Open Patent Publication No. 2015-46575

SUMMARY OF INVENTION

Technical Problem

In the process of producing a printed wiring board, a copper plating is provided to an opening of a pattern on an insulation layer, and after that, a tin plating is usually provided directly on the copper plating. In this case, when an alkaline chemical solution is used at the time of removing a photoresist after providing the tin plating, the tin plating tends to be damaged. Further, in the process of producing a semiconductor device, the same problem may be caused at the time of removing a photoresist after forming a copper plating on a semiconductor wafer and providing a tin plating on the surface thereof. The same applies to the case of using a tin alloy plating instead of a tin plating and the case of using a tin plating and a tin alloy plating in combination.

Under such circumstances, it has been desired to provide a composition and a method for removing a photoresist from a printed wiring board or semiconductor wafer while preventing corrosion of not only copper, but also tin and a tin alloy.

Solution to Problem

The present invention provides a composition for removing a photoresist, a method for removing a photoresist, and methods for producing a package substrate for mounting semiconductor devices, a semiconductor device and a semiconductor package, which comprise a step of removing a photoresist by using the aforementioned composition for removing a photoresist, as described below.

[1] A composition for removing a photoresist after forming a circuit pattern, wherein the photoresist is for forming the circuit pattern on an insulation layer at least partially having a copper wiring, wherein the circuit pattern constitutes a connecting terminal portion of the copper wiring and comprises copper and at least one selected from the group consisting of tin and a tin alloy, wherein:

the composition comprises an alkanolamine (A), a quaternary ammonium hydroxide (B), a sugar alcohol (C), a polar organic solvent (D) and water (E);

with respect to the total amount of the composition, the content of the alkanolamine (A) is 2.5 to 50% by mass, the content of the quaternary ammonium hydroxide (B) is 0.5 to 4% by mass, and the content of the sugar alcohol (C) is 0.5 to 20% by mass;

the polar organic solvent (D) is at least one selected from the group consisting of ethylene glycol monoethyl ether, 2-butoxyethanol, phenyl glycol, propylene glycol monoethyl ether, diethylene glycol monoethyl ether, diethylene glycol monobutyl ether and diethylene glycol monophenyl ether; and the composition substantially does not contain an azole compound.

[2] The composition according to item [1], wherein the etching rate at 50° C. of at least one selected from the group consisting of tin and the tin alloy is 0.1 μm/min or less.

[3] The composition according to item [1] or [2], wherein the content of the water (E) is 40% by mass or more with respect to the total amount of the composition.

[4] The composition according to any one of items [1] to [3], wherein the content of the polar organic solvent (D) is 0.5 to 10% by mass with respect to the total amount of the composition.

[5] The composition according to any one of items [1] to [4], wherein the polar organic solvent (D) is at least one selected from the group consisting of phenyl glycol and diethylene glycol monophenyl ether.

[6] The composition according to any one of items [1] to [5], wherein the sugar alcohol (C) is at least one selected from the group consisting of sorbitol, xylitol and mannitol.

[7] The composition according to any one of items [1] to [6], wherein the quaternary ammonium hydroxide (B) is at least one selected from the group consisting of tetramethylammonium hydroxide, tetraethylammonium hydroxide and triethylmethylammonium hydroxide.

[8] The composition according to any one of items [1] to [7], wherein the alkanolamine (A) is at least one selected from the group consisting of 2-aminoethanol (monoethanolamine) and 1-amino-2-propanol.

[9] The composition according to any one of items [1] to [8], wherein the connecting terminal portion is a connecting terminal portion of a copper wiring of a printed wiring board.

[10] The composition according to any one of items [1] to [8], wherein the connecting terminal portion is a connecting terminal portion of a copper wiring of a package substrate for mounting semiconductor devices or a semiconductor device.

[11] A method for removing a photoresist, wherein the photoresist is for forming a circuit pattern on an insulation layer at least partially having a copper wiring, wherein the circuit pattern constitutes a connecting terminal portion of the copper wiring and comprises copper and at least one selected from the group consisting of tin and a tin alloy, the method comprising bringing the composition according to any one of items [1] to [10] into contact with the photoresist.

[12] A method for producing a package substrate for mounting semiconductor devices, wherein the package substrate has a copper wiring and a circuit pattern, wherein the circuit pattern constitutes a connecting terminal portion of the copper wiring and comprises copper and at least one selected from the group consisting of tin and a tin alloy, the method comprising:

a step in which a copper layer is formed on an insulation layer at least partially having the copper wiring;

a step in which a dry film resist layer is formed on the surface of the copper layer and the dry film resist layer is exposed and developed to form a resist pattern made of a photoresist;

a step in which a copper plating is provided to an opening of the resist pattern and at least one selected from the group consisting of a tin plating and a tin alloy plating is provided onto the copper plating to form the circuit pattern, wherein the circuit pattern constitutes the connecting terminal portion of the copper wiring and comprises copper and at least one selected from the group consisting of tin and a tin alloy;

a step in which, after the circuit pattern is formed, the composition according to any one of items [1] to [10] is brought into contact with the photoresist to remove the photoresist; and a step in which, after the photoresist is removed, the exposed copper layer is removed.

[13] A method for producing a semiconductor device, wherein the semiconductor device has a copper wiring and a circuit pattern, wherein the circuit pattern constitutes a connecting terminal portion of the copper wiring and comprises copper and at least one selected from the group consisting of tin and a tin alloy, the method comprising:

a step in which a copper layer is formed on an insulation layer at least partially having the copper wiring;

a step in which a dry film resist layer is formed on the surface of the copper layer and the dry film resist layer is exposed and developed to form a resist pattern made of a photoresist;

a step in which a copper plating is provided to an opening of the resist pattern and at least one selected from the group consisting of a tin plating and a tin alloy plating is provided onto the copper plating to form the circuit pattern, wherein the circuit pattern constitutes the connecting terminal portion of the copper wiring and comprises copper and at least one selected from the group consisting of tin and a tin alloy;

a step in which, after the circuit pattern is formed, the composition according to any one of items [1] to [10] is brought into contact with the photoresist to remove the photoresist; and a step in which, after the photoresist is removed, the exposed copper layer is removed.

[14] A method for producing a semiconductor package, comprising electrically connecting a semiconductor device to a package substrate for mounting semiconductor devices via at least one selected from the group consisting of tin and a tin alloy, wherein:

at least one of the package substrate for mounting semiconductor devices and the semiconductor device has a circuit pattern, wherein the circuit pattern constitutes a connecting terminal portion and comprises copper and at least one selected from the group consisting of tin and a tin alloy;

in the case where the package substrate for mounting semiconductor devices has the circuit pattern, which comprises copper and at least one selected from the group consisting of tin and a tin alloy, the package substrate for mounting semiconductor devices having the circuit pattern, which comprises copper and at least one selected from the group consisting of tin and a tin alloy, is produced by the method according to item [12];

in the case where the semiconductor device has the circuit pattern, which comprises copper and at least one selected from the group consisting of tin and a tin alloy, the semiconductor device having the circuit pattern, which comprises copper and at least one selected from the group consisting of tin and a tin alloy, is produced by the method according to item [13]; and the package substrate for mounting semiconductor devices and the semiconductor device are arranged so that connecting portions thereof are opposed to each other and heating is performed to a temperature at which at least one selected from the group consisting of tin and the tin alloy is melted, thereby electrically connecting the semiconductor device to the package substrate for mounting semiconductor devices via at least one selected from the group consisting of tin and a tin alloy.

Advantageous Effects of the Invention

According to a preferred embodiment of the present invention, in a printed wiring board or semiconductor device, after a circuit pattern is formed using a photoresist on an insulation layer at least partially having a copper wiring, wherein the circuit pattern constitutes a connecting terminal portion of a copper wiring and comprises copper and at least one selected from the group consisting of tin and a tin alloy, the photoresist can be removed while suppressing damage to the circuit pattern by using the composition for removing the photoresist of the present invention.

DESCRIPTION OF EMBODIMENTS

Figure 1:
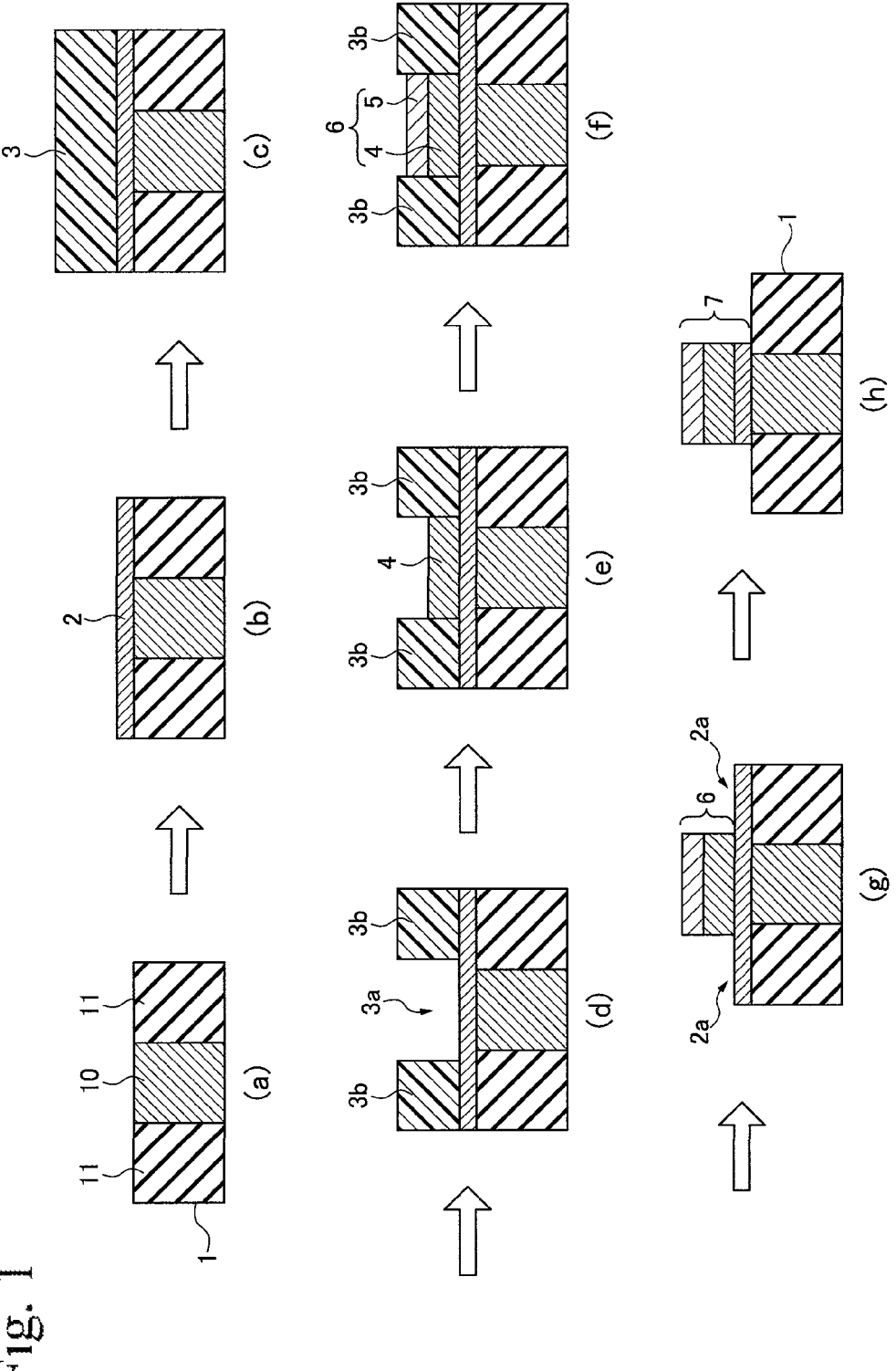
FIG. 1 shows an example of the process of the method for producing a package substrate for mounting semiconductor devices according to one embodiment of the present invention.

Hereinafter, the composition for removing a photoresist, the method for removing a photoresist, and the methods for producing a package substrate for mounting semiconductor devices, a semiconductor device and a semiconductor package, which comprise a step of removing a photoresist, according to the present invention will be specifically described. Note that the present invention is not limited thereto and can be variously modified without departing from the gist of the present invention.

1. Composition for Removing Photoresist

The composition for removing a photoresist of the present invention (hereinafter also referred to as "the composition of the present invention") is characterized in that it is a composition for removing a photoresist after forming a circuit pattern, wherein the photoresist is for forming the circuit pattern on an insulation layer at least partially having a copper wiring, wherein the circuit pattern constitutes a connecting terminal portion of the copper wiring and comprises copper and at least one selected from the group consisting of tin and a tin alloy, wherein:

the composition comprises an alkanolamine (A), a quaternary ammonium hydroxide (B), a sugar alcohol (C), a polar organic solvent (D) and water (E);

with respect to the total amount of the composition, the content of the alkanolamine (A) is 2.5 to 50% by mass, the content of the quaternary ammonium hydroxide (B) is 0.5 to 4% by mass, and the content of the sugar alcohol (C) is 0.5 to 20% by mass;

the polar organic solvent (D) is at least one selected from the group consisting of ethylene glycol monoethyl ether, 2-butoxyethanol, phenyl glycol, propylene glycol monoethyl ether, diethylene glycol monoethyl ether, diethylene glycol monobutyl ether and diethylene glycol monophenyl ether; and the composition substantially does not contain an azole compound.

The composition of the present invention can remove a photoresist for forming a circuit pattern on an insulation layer at least partially having a copper wiring, wherein the circuit pattern constitutes a connecting terminal portion of the copper wiring and comprises copper and at least one selected from the group consisting of tin and a tin alloy. According to a preferred embodiment of the present invention, after a circuit pattern is formed using a photoresist, the photoresist can be removed while suppressing damage to the obtained circuit pattern.

Note that in this specification, the "tin alloy" is a material obtained by adding at least one metallic element other than tin or non-metallic element to tin and is not particularly limited as long as it has a metallic property. The content of the aforementioned metallic element or non-metallic element in the tin alloy is not particularly limited, but tin is contained in an amount of preferably 50% by mass or more, more preferably 80% by mass or more, even more preferably 90% by mass or more, and still more preferably 98% by mass or more. Examples of the metallic element or non-metallic element include silver (Ag).

Hereinafter, components contained in the composition of the present invention will be described.

[Alkanolamine (A)]

The composition of the present invention contains an alkanolamine (A) (hereinafter also referred to as "the component (A)"). The alkanolamine (A) is not particularly limited, and examples thereof include a monoalkanolamine, a dialkanolamine, a trialkanolamine and alkylated products (N-alkylated products, O-alkylated products) thereof.

Preferred examples of the alkanolamine (A) include 2-aminoethanol (monoethanolamine), N-methylethanolamine, N-ethylethanolamine, N-propylethanolamine, N-butylethanolamine, diethanolamine, 1-amino-2-propanol (isopropanolamine), N-methylisopropanolamine, N-ethylisopropanolamine, N-propylisopropanolamine, 2-aminopropane-1-ol, N-methyl-2-amino-propane-1-ol, N-ethyl-2-amino-propane-1-ol, 1-aminopropane-3-ol, N-methyl-1-aminopropane-3-ol, N-ethyl-1-aminopropane-3-ol, 1-aminobutane-2-ol, N-methyl-1-aminobutane-2-ol, N-ethyl-1-aminobutane-2-ol, 2-aminobutane-1-ol, N-methyl-2-aminobutane-1-ol, N-ethyl-2-aminobutane-1-ol, 3-aminobutane-1-ol, N-methyl-3-aminobutane-1-ol, N-ethyl-3-aminobutane-1-ol, 1-aminobutane-4-ol, N-methyl-1-aminobutane-4-ol, N-ethyl-1-aminobutane-4-ol, 1-amino-2-methylpropane-2-ol, 2-amino-2-methylpropane-1-ol, 1-aminopentane-4-ol, 2-amino-4-methylpentane-1-ol, 2-aminohexane-1-ol, 3-aminoheptane-4-ol, 1-aminooctane-2-ol, 5-amino octane-4-ol, 1-aminopropane-2,3-diol, 2-aminopropane-1,3-diol, tris(oxymethyl)aminomethane, 1,2-diaminopropane-3-ol, 1,3-diaminopropane-2-ol and 2-(2-aminoethoxy)ethanol. These materials may be used solely, or two or more of them may be used in combination.

Among them, as the alkanolamine (A), at least one selected from the group consisting of 2-aminoethanol (monoethanolamine) and 1-amino-2-propanol is preferred.

The content of the alkanolamine (A) is 2.5 to 50% by mass, preferably 3 to 30% by mass, more preferably 3.5 to 15% by mass, and even more preferably 4 to 10% by mass with respect to the total amount of the composition. Note that in this specification, the upper limit and the lower limit of the numerical range can be suitably combined. When the content of the alkanolamine (A) is within the above-described range, satisfactory photoresist removability is obtained, and it is possible to suppress damage to a circuit pattern, which constitutes a connecting terminal portion of a copper wiring and comprises copper and at least one selected from the group consisting of tin and a tin alloy.

[Quaternary Ammonium Hydroxide (B)]

The composition of the present invention contains a quaternary ammonium hydroxide (B) (hereinafter also referred to as "the component (B)"), and for this reason, pieces of stripped photoresist can be fined to suppress generation of a residue of photoresist stripping.

The quaternary ammonium hydroxide (B) is not particularly limited, and examples thereof include tetramethylammonium hydroxide, tetraethylammonium hydroxide, tetrapropylammonium hydroxide, triethylmethylammonium hydroxide, ethyltrimethylammonium hydroxide, trimethyl (2-hydroxyethyl)ammonium hydroxide and triethyl(2-hydroxyethyl)ammonium hydroxide. These materials may be used solely, or two or more of them may be used in combination.

Among them, at least one selected from the group consisting of tetramethylammonium hydroxide, tetraethylammonium hydroxide and triethylmethylammonium hydroxide is preferred.

The content of the quaternary ammonium hydroxide (B) is 0.5 to 4% by mass, preferably 0.5 to 3.5% by mass, more preferably 1 to 3.5% by mass, and even more preferably 1 to 2% by mass with respect to the total amount of the composition. When the content of the quaternary ammonium hydroxide (B) is within the above-described range, satisfactory photoresist removability is obtained, and it is possible to suppress damage to a circuit pattern, which constitutes a connecting terminal portion of a copper wiring and comprises copper and at least one selected from the group consisting of tin and a tin alloy.

[Sugar Alcohol (C)]

The composition of the present invention contains a sugar alcohol (C) (hereinafter also referred to as "the component (C)"), and for this reason, it is possible to suppress damage to a circuit pattern, which constitutes a connecting terminal portion of a copper wiring and comprises copper and at least one selected from the group consisting of tin and a tin alloy, without reducing photoresist removability. In particular, it is possible to effectively suppress damage to a tin plating.

The sugar alcohol (C) is not particularly limited, and preferred examples thereof include threitol, erythritol, adonitol, arabitol, xylitol, talitol, sorbitol, mannitol, iditol, dulcitol and inositol. These materials may be used solely, or two or more of them may be used in combination.

Among them, at least one selected from the group consisting of sorbitol, xylitol and mannitol is preferred, and at least one selected from sorbitol and xylitol is more preferred from the viewpoint of suppression of damage to at least one selected from the group consisting of tin and a tin alloy.

The content of the sugar alcohol (C) is 0.5 to 20% by mass, preferably 1 to 20% by mass, more preferably 2 to 15% by mass, and even more preferably 3 to 10% by mass with respect to the total amount of the composition. When the content of the sugar alcohol (C) is within the above-described range, satisfactory photoresist removability is obtained, and it is possible to suppress damage to a circuit pattern, which constitutes a connecting terminal portion of a copper wiring and comprises copper and at least one selected from the group consisting of tin and a tin alloy.

[Polar Organic Solvent (D)]

The composition of the present invention contains a polar organic solvent (D) (hereinafter also referred to as "the component (D)"), and for this reason, it is considered that permeability of the composition to the photoresist is improved, and further, satisfactory photoresist removability is obtained, and it is possible to suppress generation of a residue of photoresist stripping.

As the polar organic solvent (D), at least one selected from the group consisting of ethylene glycol monoethyl ether, 2-butoxyethanol, ethylene glycol monophenyl ether (phenyl glycol), propylene glycol monoethyl ether, diethylene glycol monoethyl ether, diethylene glycol monobutyl ether and diethylene glycol monophenyl ether is used. Among them, ethylene glycol monophenyl ether and diethylene glycol monophenyl ether are preferred from the viewpoint of suppression of damage to at least one selected from the group consisting of tin and a tin alloy. These materials may be used solely, or two or more of them may be used in combination. In the present invention, by using these specific polar organic solvents, photoresist removability can be improved. In the case of a polar organic solvent other than the above-described materials, for example, a polar organic solvent whose alkyl ether moiety is methyl ether, photoresist removability is reduced.

The content of the polar organic solvent (D) is preferably 0.5 to 10% by mass, more preferably 1 to 10% by mass, even more preferably 1.5 to 8% by mass, and still more preferably 2 to 6% by mass with respect to the total amount of the composition. When the content of the polar organic solvent (D) is within the above-described range, more satisfactory photoresist removability is obtained, and it is possible to suppress damage to a circuit pattern, which constitutes a connecting terminal portion of a copper wiring and comprises copper and at least one selected from the group consisting of tin and a tin alloy.

[Water (E)]

The composition of the present invention contains water (E) (hereinafter also referred to as "the component (E)"). The water (E) is not particularly limited, but it is preferably water from which metal ions, organic impurities, particles, etc. have been removed by distillation, ion exchange treatment, filtering treatment, adsorption treatment or the like. Pure water is more preferred, and ultrapure water is particularly preferred.

The content of the water (E) is the remainder in the composition of the present invention, and it is preferably 40% by mass or more, more preferably more than 40% by mass, even more preferably 40 to 99% by mass, still more preferably 50 to 97% by mass, still even more preferably 60 to 95% by mass, and particularly preferably 70 to 95% by mass with respect to the total amount of the composition. When the content of the water is within the above-described range, reactivity of the alkanolamine (A) and the quaternary ammonium hydroxide (B) to the photoresist is improved, and for this reason, photoresist removability can be improved. When the amount of the water is too small, photoresist removability may be reduced.

[Other Components]

According to need, the composition of the present invention may contain other components within ranges in which the effects of the composition of the present invention are not inhibited.

Examples of the other components include a surfactant and a defoaming agent.

The azole compound easily adsorbs to copper and remains on the copper surface after the chemical treatment, and for this reason, it causes poor electrical connection in the subsequent process. The azole compound can be removed from the copper surface by acid washing or alkali washing, but in this case, tin and a tin alloy are corroded at the same time. Accordingly, for preventing adsorption of the azole compound to copper, the composition of the present invention substantially does not contain the azole compound. In this regard, the expression "substantially does not contain the azole compound" means that the content of the azole compound is less than 0.01% by mass with respect to the total amount of the composition. The content of the azole compound is more preferably less than 0.001% by mass, and even more preferably less than 0.0001% by mass, and particularly preferably, the composition does not contain the azole compound.

It is preferred that damage to tin and a tin alloy given by the composition of the present invention is small. For example, when the composition of the present invention is brought into contact by means of spraying or the like, the etching rate at 50° C. of at least one selected from the group consisting of tin and a tin alloy is preferably 0.1 μm/min or less, more preferably 0.07 μm/min or less, even more preferably 0.05 μm/min or less, and particularly preferably 0.03 μm/min or less. The etching rate can be measured by the method described in the Examples.

Note that the composition of the present invention is preferably a solution and does not contain solid particles such as abrasive particles.

[Preparation of Composition]

The composition of the present invention can be prepared by homogeneously stirring the component (A), the component (B), the component (C), the component (D) and the component (E), and according to need, other components. The method for stirring these components is not particularly limited, and a stirring method usually used can be employed.

[Intended Use of Composition]

The composition of the present invention can be suitably used at the time of removing a photoresist after forming a circuit pattern, wherein the photoresist is for forming the circuit pattern on an insulation layer at least partially having a copper wiring, wherein the circuit pattern constitutes a connecting terminal portion of the copper wiring and comprises copper and at least one selected from the group consisting of tin and a tin alloy.

In this regard, the "insulation layer at least partially having the copper wiring" is not particularly limited as long as it is an insulation layer in which the copper wiring is embedded in the surface or inside thereof, and examples thereof include a silicon insulation layer of a printed wiring board, a package substrate for mounting semiconductor devices, a semiconductor wafer or the like.

Further, the "circuit pattern" which constitutes the connecting terminal portion of the copper wiring and comprises copper and at least one selected from the group consisting of tin and a tin alloy, is for electrically connecting to another member constituting the connecting terminal portion of the copper wiring possessed by the insulation layer. In one embodiment of the present invention, the connecting terminal portion is a connecting terminal portion of a copper wiring of a printed wiring board. Further, in one embodiment of the present invention, the connecting terminal portion is a connecting terminal portion of a copper wiring of a package substrate for mounting semiconductor devices. Further, in one embodiment of the present invention, the connecting terminal portion is a connecting terminal portion of a copper wiring of a semiconductor device.

For example, the composition of the present invention can be suitably used at the time of removing a photoresist after forming a circuit pattern, wherein the photoresist is for forming the circuit pattern on an insulation layer at least partially having a copper wiring, wherein the circuit pattern constitutes a connecting terminal portion of the copper wiring and comprises copper and at least one selected from the group consisting of tin and a tin alloy in the process of producing a printed wiring board (e.g., a package substrate for mounting semiconductor devices).

Further, the composition of the present invention can be suitably used at the time of removing a photoresist after forming a circuit pattern, wherein the photoresist is for forming the circuit pattern on an insulation layer at least partially having a copper wiring, wherein the circuit pattern constitutes a connecting terminal portion of the copper wiring and comprises copper and at least one selected from the group consisting of tin and a tin alloy in the process of producing a semiconductor device.

In this regard, examples of the photoresist to be used for the printed wiring board include a composition comprising a binder polymer, a photopolymerizable monomer, a photopolymerization initiator and other additives.

Examples of the binder polymer include a product obtained by copolymerizing several types of vinyl monomers such as methacrylic acid ester, acrylic acid ester and styrene, including at least one of methacrylic acid and acrylic acid as an essential component.

Preferred examples of the photopolymerizable monomer include at least one of methacrylic acid ester and acrylic acid ester.

Examples of the photopolymerization initiator include at least one selected from the group consisting of benzophenone, 4,4'-diaminobenzophenone, 4,4'-bis(dimethylamino) benzophenone, 2-ethylanthraquinone, benzoin, benzoin methyl ether, 9-phenylacridine, benzyl dimethyl ketal and benzyl diethyl ketal. Further, a bimolecular system consisting of hexaarylbiimidazole and a hydrogen donor (2-mercaptobenzoxazole, N-phenylglycine) may also be used.

Examples of the other additives include a thermal polymerization initiator and a dye.

Preferred examples of the photoresist to be used for the semiconductor device include a combination of a phenol-formaldehyde resin (collectively referred to as "novolac resin") and a naphthoquinone diazide compound that is a photosensitive component.

The temperature of the composition of the present invention at the time of use is not particularly limited, but it is preferably 10 to 70° C., more preferably 20 to 65° C., and even more preferably 25 to 60° C. When the temperature of the composition of the present invention is 10° C. or higher, satisfactory photoresist removability is obtained, and therefore an excellent production efficiency is obtained. Meanwhile, when the temperature of the composition of the present invention is 70° C. or lower, it is possible to suppress composition change of the composition and to keep conditions for removing the photoresist constant. Photoresist removability is improved by increasing the temperature of the composition, but the optimum treatment temperature may be suitably determined in consideration of suppression of composition change of the composition, etc.

Further, the time for the treatment using the composition of the present invention is not particularly limited, but it is preferably 20 to 600 seconds, and more preferably 30 to 300 seconds, and it may be 30 to 240 seconds. The treatment time may be suitably selected depending on various conditions including surface conditions of the photoresist as an object to be removed, the concentration and temperature of the composition and the treatment method.

The method for bringing the composition of the present invention into contact with the photoresist is not particularly limited. For example, it is possible to employ a method of bringing the composition of the present invention into contact with the photoresist as an object to be removed by means of dropping (single wafer spin process), spraying or the like, or a method of immersing the photoresist as the object to be removed in the composition of the present invention. In the present invention, any of such methods may be employed.

2. Method for Removing Photoresist

The method for removing a photoresist of the present invention comprises bringing the composition of the present invention into contact with the photoresist for forming a circuit pattern on an insulation layer at least partially having a copper wiring, wherein the circuit pattern constitutes a connecting terminal portion of the copper wiring and comprises copper and at least one selected from the group consisting of tin and a tin alloy.

The composition of the present invention, the temperature at the time of use and the treatment time are as described in "1. Composition for removing photoresist" above. The method for bringing the composition of the present invention into contact with the photoresist is also as described in "1. Composition for removing photoresist" above. According to a preferred embodiment of the present invention, by using the composition of the present invention, the photoresist can be removed while suppressing damage to the circuit pattern, which constitutes a connecting terminal portion of a copper wiring and comprises copper and at least one selected from the group consisting of tin and a tin alloy. This allows the circuit pattern, which constitutes the connecting terminal portion of the copper wiring and comprises copper and at least one selected from the group consisting of tin and a tin alloy, to be formed on the insulation layer at least partially having the copper wiring with a high yield.

3. Method for Producing Package Substrate for Mounting Semiconductor Devices

The method for producing a package substrate for mounting semiconductor devices of the present invention is characterized in that it is a method for producing a package substrate for mounting semiconductor devices, wherein the package substrate has a copper wiring and a circuit pattern, wherein the circuit pattern constitutes a connecting terminal portion of the copper wiring and comprises copper and at least one selected from the group consisting of tin and a tin alloy, the method comprising:

a step in which a copper layer is formed on an insulation layer at least partially having the copper wiring;

a step in which a dry film resist layer is formed on the surface of the copper layer and the dry film resist layer is exposed and developed to form a resist pattern made of a photoresist;

a step in which a copper plating is provided to an opening of the resist pattern and at least one selected from the group consisting of a tin plating and a tin alloy plating is provided onto the copper plating to form the circuit pattern, wherein the circuit pattern constitutes the connecting terminal portion of the copper wiring and comprises copper and at least one selected from the group consisting of tin and a tin alloys;

a step in which, after the circuit pattern is formed, the composition of the present invention is brought into contact with the photoresist to remove the photoresist; and a step in which, after the photoresist is removed, the exposed copper layer is removed.

Hereinafter, the method for producing a package substrate for mounting semiconductor devices of the present invention will be described based on drawings.

FIG. 1 shows an example of the process of the method for producing a package substrate for mounting semiconductor devices according to one embodiment of the present invention.

As shown in FIG. 1(a), firstly, a resin substrate 1 which is an insulation layer partially having a copper wiring 10, wherein the copper wiring 10 is embedded between interlayer insulating resins 11, is prepared.

Next, as shown in FIG. 1(b), a copper layer 2 is formed on the surface of the resin substrate 1. The copper layer 2 may be formed by providing a chemical copper plating (electroless copper plating) on the surface of the resin substrate 1, or alternatively, a copper foil layer may be formed using an ultrathin copper foil with a carrier copper foil or the like, for example, in the Modified Semi-Additive Process (M-SAP), or alternatively, a copper film may be formed by means of sputtering. In the case of forming the copper layer 2 by means of sputtering, optionally, before forming the copper layer 2, a barrier metal layer such as a titanium layer and a nickel-chromium alloy layer may be formed (not shown) and then the copper layer 2 may be formed thereon. In the method for producing a package substrate for mounting semiconductor devices of the present invention, the copper layer 2 is preferably formed by chemical copper plating.

Subsequently, as shown in FIG. 1(c), a dry film resist layer 3 is formed on the surface of the copper layer 2, a circuit mask pattern is provided thereon (not shown), and exposure and development are performed to form a resist pattern made of a photoresist 3b, which has an opening 3a, wherein the surface of the copper layer 2 is partially exposed as shown in FIG. 1(d).

Next, as shown in FIG. 1(e), electric copper plating (electrolytic copper plating) is provided to the opening 3a of the resist pattern to form a copper layer 4. Further, as shown in FIG. 1(f), tin plating or tin alloy plating is provided on the surface of the copper layer 4 to form a tin layer or tin alloy layer 5, thereby forming a circuit pattern 6, which constitutes the connecting terminal portion of the copper wiring 10 and comprises copper and at least one selected from the group consisting of tin and a tin alloy. Alternatively, tin plating and tin alloy plating may be sequentially provided on the surface of the copper layer 4 to form a tin layer and a tin alloy layer, thereby forming a circuit pattern, which constitutes the connecting terminal portion of the copper wiring 10 and comprises copper, tin and a tin alloy. In this case, the order of tin plating and tin alloy plating is not particularly limited and may be suitably determined.

After the circuit pattern 6 is formed, the composition of the present invention is brought into contact with the photoresist 3b to remove the photoresist 3b as shown in FIG. 1(g).

Subsequently, an exposed portion 2a of the exposed copper layer 2 is removed, thereby forming a connecting terminal portion 7 of the copper wiring 10 on the resin substrate 1 as shown in FIG. 1(h).

In the above-described manner, the package substrate for mounting semiconductor devices having the copper wiring and the circuit pattern, wherein the circuit pattern constitutes the connecting terminal portion of the copper wiring and comprises copper and at least one selected from the group consisting of tin and a tin alloy, can be produced. The connecting terminal portion 7 can be used when mounting a component such as a semiconductor device on the package substrate for mounting semiconductor devices.

A connecting terminal portion of another printed wiring board, for example, a motherboard that is referred to as a "high-density mounting wiring board" and produced by the additive process can be produced in a manner similar to that in the method for producing a package substrate for mounting semiconductor devices of the present invention.

4. Method for Producing Semiconductor Device

Next, the method for producing a semiconductor device of the present invention will be described.

The method for producing a semiconductor device of the present invention is characterized in that it is a method for producing a semiconductor device, wherein the semiconductor device has a copper wiring and a circuit pattern, wherein the circuit pattern constitutes a connecting terminal portion of the copper wiring and comprises copper and at least one selected from the group consisting of tin and a tin alloy, the method comprising:

a step in which a copper layer is formed on an insulation layer at least partially having the copper wiring;

a step in which a dry film resist layer is formed on the surface of the copper layer and the dry film resist layer is exposed and developed to form a resist pattern made of a photoresist;

a step in which a copper plating is provided to an opening of the resist pattern and at least one selected from the group consisting of a tin plating and a tin alloy plating is provided onto the copper plating to form the circuit pattern, wherein the circuit pattern constitutes the connecting terminal portion of the copper wiring and comprises copper and at least one selected from the group consisting of tin and a tin alloys;

a step in which, after the circuit pattern is formed, the composition of the present invention is brought into contact with the photoresist to remove the photoresist; and a step in which, after the photoresist is removed, the exposed copper layer is removed.

Figure 2:
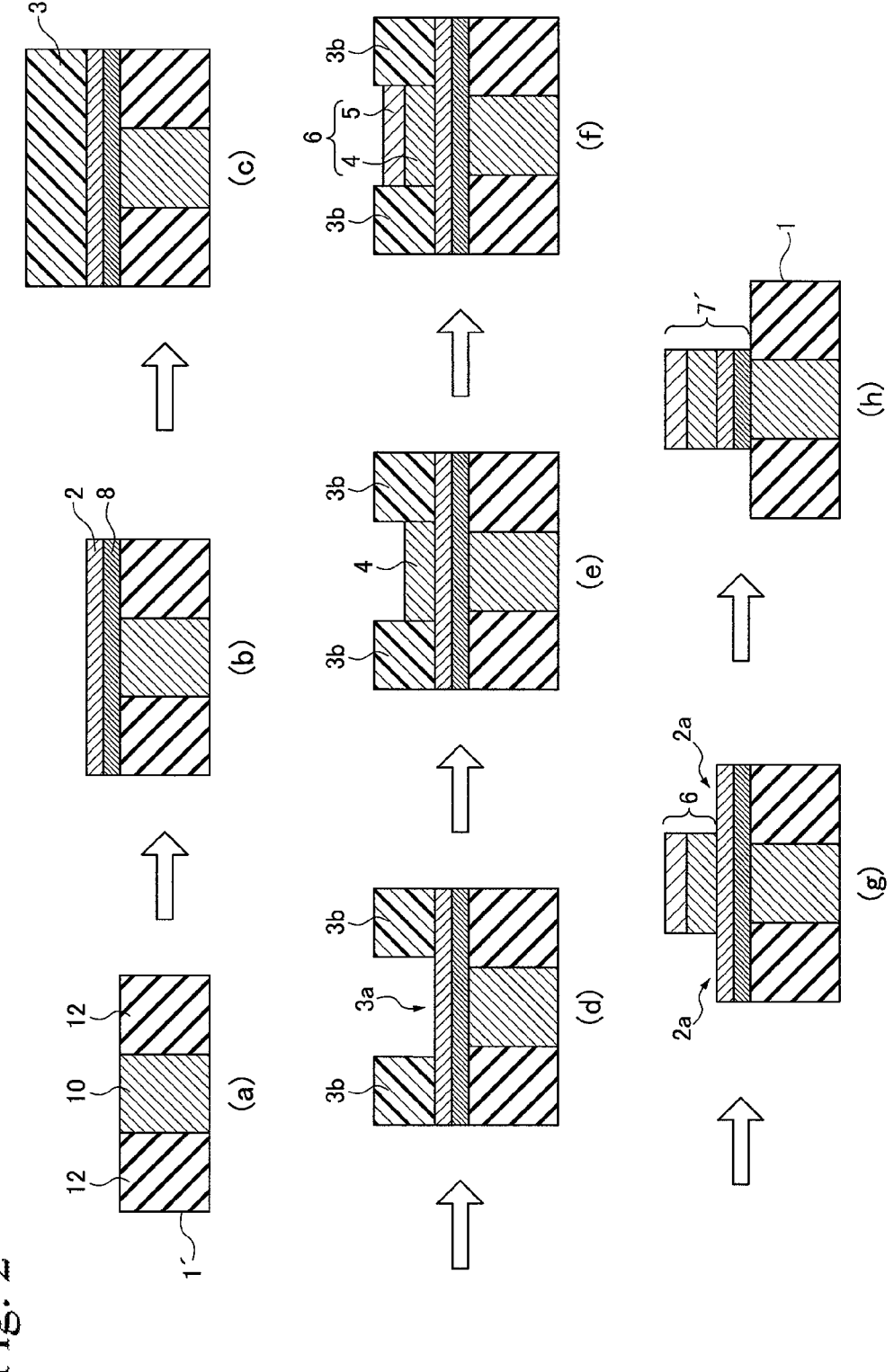
FIG. 2 shows an example of the process of the method for producing a semiconductor device according to one embodiment of the present invention.
Figure 3:
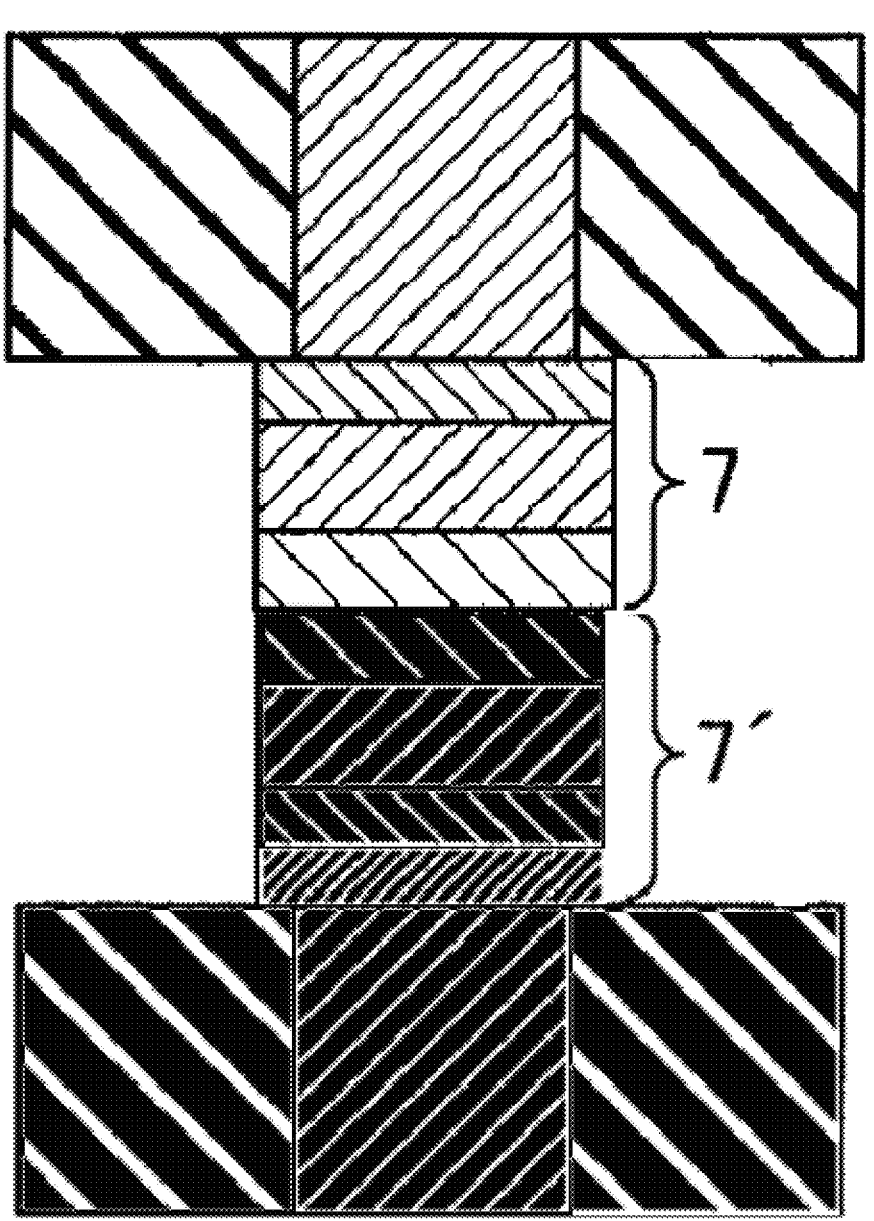
FIG. 3 shows an example of a semiconductor package formed by bringing together a package substrate as shown in FIG. 1 and a semiconductor device as shown in FIG. 2 (shown with colors inverted for clarity).

FIG. 2 shows an example of the process of the method for producing a semiconductor device according to one embodiment of the present invention.

As shown in FIG. 2(a), firstly, a silicon substrate 1' which is an insulation layer partially having a copper wiring 10, wherein the copper wiring 10 is embedded between silicon insulation layers 12, is prepared.

Next, as shown in FIG. 2(b), a copper layer 2 is formed on the surface of the silicon substrate 1'. The copper layer 2 may be formed by providing a chemical copper plating on the surface of the silicon substrate 1', or alternatively, a copper film may be formed by means of sputtering. In the method for producing a semiconductor device of the present invention, the copper layer 2 is preferably formed by forming a copper film by means of sputtering. Optionally, before forming the copper layer 2, a barrier metal layer 8 such as a titanium layer may be formed and then the copper layer 2 may be formed thereon, and another layer may be further formed (not shown) between the copper layer 2 and the barrier metal layer 8. The barrier metal layer 8 such as a titanium layer may be formed, for example, by forming a film by means of sputtering.

Subsequently, as shown in FIG. 2(c), a dry film resist layer 3 is formed on the surface of the copper layer 2, a circuit mask pattern is provided thereon (not shown), and exposure and development are performed to form a resist pattern made of a photoresist 3b, which has an opening 3a, wherein the surface of the copper layer 2 is partially exposed as shown in FIG. 2(d).

Next, as shown in FIG. 2(e), electric copper plating is provided to the opening 3a of the resist pattern to form a copper layer 4. Further, as shown in FIG. 2(d), tin plating or tin alloy plating is provided on the surface of the copper layer 4 to form a tin layer or tin alloy layer 5, thereby forming a circuit pattern 6, which constitutes the connecting terminal portion of the copper wiring 10 and comprises copper and at least one selected from the group consisting of tin and a tin alloy. Alternatively, tin plating and tin alloy plating may be sequentially provided on the surface of the copper layer 4 to form a tin layer and a tin alloy layer, thereby forming a circuit pattern which constitutes the connecting terminal portion of the copper wiring 10 and comprises copper, tin and a tin alloy. In this case, the order of tin plating and tin alloy plating is not particularly limited and may be suitably determined.

After the circuit pattern 6 is formed, the composition of the present invention is brought into contact with the photoresist 3b to remove the photoresist 3b as shown in FIG. 2(g).

Subsequently, an exposed portion 2a of the exposed copper layer 2 is removed, and further, the barrier metal layer 8 exposed by removal of the exposed portion 2a is removed, thereby forming a connecting terminal portion 7' of the copper wiring 10 on the silicon substrate 1' as shown in FIG. 2(h). After that, the silicon substrate 1' can be cut into a predetermined size to be used as a semiconductor device.

In the above-described manner, the semiconductor device having the copper wiring and the circuit pattern, wherein the circuit pattern constitutes the connecting terminal portion of the copper wiring and comprises copper and at least one selected from the group consisting of tin and a tin alloy, can be produced. The connecting terminal portion 7' can be used when mounting the obtained semiconductor device on the package substrate for mounting semiconductor devices or the like.

5. Method for Producing Semiconductor Package

Next, the method for producing a semiconductor package of the present invention will be described.

The method for producing a semiconductor package of the present invention is characterized in that it is a method for producing a semiconductor package, comprising electrically connecting a semiconductor device to a package substrate for mounting semiconductor devices via at least one selected from the group consisting of tin and a tin alloy, wherein:

at least one of the package substrate for mounting semiconductor devices and the semiconductor device has a circuit pattern, wherein the circuit pattern constitutes a connecting terminal portion and comprises copper and at least one selected from the group consisting of tin and a tin alloys;

in the case where the package substrate for mounting semiconductor devices has the circuit pattern, which comprises copper and at least one selected from the group consisting of tin and a tin alloys, the package substrate for mounting semiconductor devices having the circuit pattern, which comprises copper and at least one selected from the group consisting of tin and a tin alloys, is produced by the aforementioned method for producing the package substrate for mounting semiconductor devices;

in the case where the semiconductor device has the circuit pattern, which comprises copper and at least one selected from the group consisting of tin and a tin alloys, the semiconductor device having the circuit pattern, which comprises copper and at least one selected from the group consisting of tin and a tin alloys, is produced by the aforementioned method for producing the semiconductor device; and the package substrate for mounting semiconductor devices and the semiconductor device are arranged so that connecting portions thereof are opposed to each other and heating is performed to a temperature at which at least one selected from the group consisting of tin and the tin alloy is melted, thereby electrically connecting the semiconductor device to the package substrate for mounting semiconductor devices via at least one selected from the group consisting of tin and a tin alloy.

In the method for producing a semiconductor package of the present invention, one or both of a package substrate for mounting semiconductor devices and a semiconductor device have a circuit pattern, which constitutes a connecting terminal portion and comprises copper and at least one selected from the group consisting of tin and a tin alloy. Further, the package substrate for mounting semiconductor devices and the semiconductor device are arranged so that connecting portions thereof are opposed to each other, and heating is performed to a temperature at which at least one selected from the group consisting of tin and the tin alloy possessed by the circuit pattern is melted, thereby electrically connecting the semiconductor device to the package substrate for mounting semiconductor devices via at least one selected from the group consisting of tin and the tin alloy.

The heating temperature in this case is not particularly limited as long as it is a temperature at which at least one selected from the group consisting of tin and the tin alloy is melted, but from the viewpoint of obtaining satisfactory electrical connection between the package substrate for mounting semiconductor devices and the semiconductor device and preventing damage thereto, the heating temperature is usually 180 to 280° C., preferably 180 to 260° C., and more preferably 180 to 240° C.

As described above, in the method for producing a semiconductor package of the present invention, at least one of the package substrate for mounting semiconductor devices and the semiconductor device to be connected has the circuit pattern, which constitutes the connecting terminal portion and comprises copper and at least one selected from the group consisting of tin and a tin alloy, and for this reason, the semiconductor device can be electrically connected to the package substrate for mounting semiconductor devices via at least one selected from the group consisting of tin and the tin alloy. According to a preferred embodiment of the present invention, when compared to the case where the semiconductor device is electrically connected to the package substrate for mounting semiconductor devices by directly applying a conventional solder ball or solder paste to a connecting member, it is easier to control electrical connection, and requirements for density increase and size reduction of wirings of electronic devices can be satisfied.

In one embodiment of the present invention, electrical connection may be enhanced by further arranging a bonding agent such as a solder ball and a solder paste on the tin layer or tin alloy layer of the circuit pattern which constitutes the connecting terminal portion and comprises copper and at least one selected from the group consisting of tin and a tin alloy, which is possessed by at least one of the package substrate for mounting semiconductor devices and the semiconductor device. By arranging the bonding agent such as the solder ball and the solder paste via the connecting terminal portion, electrical connection can be more easily controlled when compared to the case where the bonding agent is directly applied to the connecting member.

After the semiconductor device is electrically connected to the package substrate for mounting semiconductor devices, in order to ensure electrical connection strength and mechanical connection strength, it is preferred inject a sealing resin to seal the gap between the package substrate for mounting semiconductor devices and the semiconductor device.

EXAMPLES

Hereinafter, the present invention will be specifically described based on working examples, but embodiments can be suitably changed within a range in which the effects of the present invention are exerted.

Examples 1-28

Using the composition described in Table 1, the component (A), the component (B), the component (C), the component (D), the component (E) and other optional components were put into a glass beaker having a capacity of 1 L, and the mixture was stirred to be homogeneous to prepare an aqueous composition.

Comparative Examples 1-16

An aqueous composition was prepared in a manner similar to that in the above-described Examples, except that the composition described in Table 2 was used.

[Preparation of Sample for Evaluation of Photoresist Removability]

A chemical copper plating ("THRU-CUP PEAver.2" manufactured by C. Uyemura & Co., Ltd.) was provided on an insulation layer ("ABF-GX-92" manufactured by Ajinomoto Fine-Techno Co., Inc.) to form a copper thin film (thickness: 0.8 μm). A dry film resist ("RD-1225" manufactured by Hitachi Chemical Company, Ltd., thickness: 25 μm) was adhered to the surface of the copper thin film, a circuit mask pattern was provided thereon, and exposure and development were performed. An electric copper plating (thickness: 20 μm) was provided to an opening of a circuit pattern formed by exposure and development of the dry film resist, thereby obtaining a sample for evaluation of photoresist removability.

[Preparation of Sample for Evaluation of Anticorrosion Property for Tin]

A tin plating (thickness: 10 μm) manufactured by Ishihara Chemical Co., Ltd. was provided on the surface of a copper-clad laminated plate ("CCL-HL832HS 12/12HS-L" manufactured by Mitsubishi Gas Chemical Company, Inc.), thereby obtaining a sample for evaluation of anticorrosion property for tin.

<Evaluation Methods>

The aqueous composition having the composition described in Table 1 or 2 was brought into contact with the sample for evaluation of photoresist removability and the sample for evaluation of anticorrosion property for tin, respectively, by means of spraying at 50° C. and at a spray pressure of 0.15 MPa for 3 minutes.

Regarding photoresist removability, the level of removal of the photoresist of the sample for evaluation of photoresist removability was confirmed by using an optical microscope "Olympus MX-61L objective lens 50×".

<Criteria for Evaluation of Photoresist Removability>

A: The photoresist was entirely removed.

B: The photoresist partially remained.

C: The photoresist was not removed at all.

<Evaluation of Anticorrosion Property for Tin>

Regarding evaluation of anticorrosion property for tin, the masses of the sample before and after the treatment were measured, the thickness of the etched portion was calculated from the difference between the masses, the density of tin (7.37 g/cm$^3$) and the size of the sample (treatment area [m$^2$], since the back surface of the sample was protected with a masking tape, the treatment area is the area of the front surface of the sample), and the etching amount per minute (etching rate of tin) was obtained by the following formula.

Etching rate of tin [μm/min]=(mass of sample before treatment [g]−mass of sample after treatment [g])/{(treatment area [m$^2$]×7.37 [g/cm$^3$] (density of tin)×treatment time [min])}

The case where the etching rate was 0.1 μm/min or lower is regarded as acceptable, and the case where the etching rate was 0.05 μm/min or lower is particularly excellent.

The results are shown in Tables 1 and 2.

TABLE 1

| | Composition [% by mass] | | | | | | | | | Sn etching rate [um/min] | Dry film resist removability |
| | Alkanolamine (A) | | Tetramethylammonium hydroxide (B) | Sugar alcohol (C) | | Polar organic solvent (D) | | Water (E) | | | |
|---|---|---|---|---|---|---|---|---|---|---|---|
| Example 1 | 2-aminoethanol | 5 | 1 | Sorbitol | 4 | PhGE | 2.5 | 87.5 | | 0.01 | A |
| Example 2 | ↑ | 10 | 1.5 | ↑ | 4 | PhGE | 2.5 | 82 | | 0.01 | A |
| Example 3 | ↑ | 20 | 1.5 | ↑ | 4 | PhGE | 4 | 70.5 | | 0.01 | A |
| Example 4 | ↑ | 8.8 | 3.3 | ↑ | 4 | PhGE | 3.1 | 80.9 | | 0.04 | A |
| Example 5 | ↑ | 8.8 | 3.3 | ↑ | 2 | PhGE | 4.4 | 81.6 | | 0.05 | A |
| Example 6 | ↑ | 3 | 3.3 | ↑ | 4 | PhGE | 2.5 | 87.2 | | 0.01 | A |
| Example 7 | ↑ | 4 | 3.3 | ↑ | 4 | PhGE | 2.5 | 86.2 | | 0.01 | A |
| Example 8 | ↑ | 6 | 1.5 | ↑ | 2.5 | PhGE | 5 | 85 | | 0.01 | A |
| Example 9 | ↑ | 5 | 1 | ↑ | 15 | PhGE | 2.5 | 76.5 | | 0.01 | A |
| Example 10 | ↑ | 5 | 1 | ↑ | 1 | PhGE | 2.5 | 90.5 | | 0.02 | A |
| Example 11 | ↑ | 5 | 1.5 | ↑ | 0.5 | PhGE | 2.5 | 90.5 | | 0.07 | A |
| Example 12 | ↑ | 10 | 1 | ↑ | 4 | PhGE | 2.5 | 82.5 | | 0.03 | A |
| Example 13 | ↑ | 6 | 1.5 | Xylitol | 4 | PhGE | 2.5 | 86 | | 0.01 | A |
| Example 14 | ↑ | 6 | 1.5 | Mannitol | 4 | PhGE | 2.5 | 86 | | 0.05 | A |
| Example 15 | 1-amino-2-propanol | 6 | 1.5 | Sorbitol | 4 | PhGE | 2.5 | 86 | | 0.02 | A |
| Example 16 | 2-aminoethanol | 30 | 1.5 | ↑ | 4 | PhGE | 4 | 60.5 | | 0.01 | A |
| Example 17 | ↑ | 30 | 4 | ↑ | 4 | PhGE | 4 | 58 | | 0.01 | A |
| Example 18 | ↑ | 50 | 1.5 | ↑ | 4 | PhGE | 4 | 40.5 | | 0.02 | A |
| Example 19 | ↑ | 30 | 4 | ↑ | 1 | PhGE | 4 | 61 | | 0.04 | A |
| Example 20 | ↑ | 50 | 4 | ↑ | 1 | PhGE | 2.5 | 42.5 | | 0.05 | A |
| Example 21 | ↑ | 30 | 1.5 | ↑ | 0.5 | PhGE | 2.5 | 65.5 | | 0.02 | A |
| Example 22 | ↑ | 30 | 4 | ↑ | 0.5 | PhGE | 2.5 | 63 | | 0.01 | A |
| Example 23 | ↑ | 6 | 1.5 | ↑ | 2.5 | EDG | 5 | 85 | | 0.01 | A |
| Example 24 | ↑ | 6 | 1.5 | ↑ | 2.5 | DGBE | 5 | 85 | | 0.04 | A |
| Example 25 | ↑ | 6 | 1.5 | ↑ | 2.5 | 2-butoxyethanol | 5 | 85 | | 0.04 | A |
| Example 26 | ↑ | 6 | 1.5 | ↑ | 2.5 | Propylene glycol monoethyl ether | 5 | 85 | | 0.02 | A |
| Example 27 | ↑ | 6 | 1.5 | ↑ | 2.5 | Diethylene glycol monophenyl ether | 5 | 85 | | 0.01 | A |
| Example 28 | ↑ | 6 | 1.5 | ↑ | 2.5 | Ethylene glycol monoethyl ether | 5 | 85 | | 0.02 | A |

PhGE phenyl glycol = 2-phenoxyethanol = ethylene glycol monophenyl ether
EDG diethylene glycol monoethyl ether
DGBE diethylene glycol monobutyl ether

TABLE 2

| | Composition [% by mass] | | | | | | | | Sn etching rate [um/min] | Dry film resist removability |
| | Alkanolamine | | Tetramethylammonium hydroxide (B) | Sugar alcohol (C) | | Polar organic solvent (D) | | Water (E) | | |
|---|---|---|---|---|---|---|---|---|---|---|
| Comparative Example 1 | — | 0 | 1.5 | Sorbitol | 4 | PhGE | 2.5 | 92 | 0.02 | C |
| Comparative Example 2 | 2-aminoethanol | 6 | 0 | ↑ | 4 | PhGE | 2.5 | 87.5 | 0.01 | C |
| Comparative Example 3 | ↑ | 6 | 1.5 | — | 0 | PhGE | 2.5 | 90 | 0.19 | A |
| Comparative Example 4 | ↑ | 6 | 1.5 | Sorbitol | 4 | — | 0 | 88.5 | 0.01 | C |
| Comparative Example 5 | ↑ | 5.5 | 1 | — | 0 | — | 0 | 93.5 | 0.26 | A |
| Comparative Example 6 | ↑ | 8 | 4.5 | Sorbitol | 4 | PhGE | 4 | 79.5 | 0.15 | A |

TABLE 2-continued

| | | Composition [% by mass] | | | | | | Sn etching | Dry film |
| | | | | | | | | rate | resist |
| | Alkanolamine | | Tetramethylammonium hydroxide (B) | Sugar alcohol (C) | | Polar organic solvent (D) | | Water (E) | [um/min] | removability |
|---|---|---|---|---|---|---|---|---|---|---|
| Comparative Example 7 | ↑ | 2 | 3.3 | ↑ | 4 | PhGE | 2.5 | 88.2 | 0.01 | B |
| Comparative Example 8 | ↑ | 35 | 3 | ↑ | 10 | DGME | 20 | 32 | 0.02 | C |
| Comparative Example 9 | ↑ | 9.97 | 0.24 | ↑ | 0.4 | DMSO | 79.76 | 9.63 | 0.01 | C |
| Comparative Example 10 | ↑ | 30 | 1 | ↑ | 5 | NMP | 50 | 14 | 0.19 | A |
| Comparative Example 11 | ↑ | 25 | 5 | ↑ | 10 | DGME | 20 | 40 | 0.02 | B |
| Comparative Example 12 | ↑ | 6 | 1.5 | ↑ | 2.5 | DGME | 5 | 85 | 0.03 | C |
| Comparative Example 13 | ↑ | 6 | 1.5 | ↑ | 2.5 | MFDG | 5 | 85 | 0.03 | B |
| Comparative Example 14 | ↑ | 6 | 1.5 | ↑ | 2.5 | Ethylene glycol monomethyl ether | 5 | 85 | 0.05 | B |
| Comparative Example 15 | ↑ | 6 | 1.5 | ↑ | 2.5 | Diethylene glycol dimethyl ether | 5 | 85 | 0.05 | B |
| Comparative Example 16 | ↑ | 6 | 1.5 | ↑ | 2.5 | Propylene glycol monomethyl ether | 5 | 85 | 0.03 | B |

PhGE phenyl glycol = 2-phenoxyethanol = ethylene glycol monophenyl ether
DGME diethylene glycol monomethyl ether
DMSO dimethyl sulfoxide
NMP N-methyl-2-pyrrolidone = 1-methyl-2-pyrrolidone
MFDG dipropylene glycol monomethyl ether As shown in Table 1, regarding all the aqueous compositions of Examples 1-28, the photoresist was entirely removed and anticorrosion property for tin was satisfactory.

Meanwhile, as shown in Table 2, regarding all the aqueous compositions of Comparative Examples 1-16, photoresist removability was insufficient or anticorrosion property for tin was insufficient.

REFERENCE SIGNS LIST 1 resin substrate
1' silicon substrate
2 copper layer
2a exposed portion
3 dry film resist
3a opening
3b photoresist
4 copper layer
5 tin layer or tin alloy layer
6 circuit pattern
7 connecting terminal portion
7' connecting terminal portion
8 barrier metal layer
10 copper wiring
11 interlayer insulating resin
12 silicon insulation layer

The invention claimed is:

1. A method for producing a package substrate having a copper wiring and a circuit pattern, the method comprising:
   forming a copper layer on an insulation layer at least partially having the copper wiring;
   forming a dry film resist layer on the copper layer;
   exposing the dry film resist layer;
   developing the dry film resist layer such that a resist pattern comprising a photoresist is formed;
   forming a copper plating on an opening of the resist pattern;

forming at least one selected from the group consisting of a tin plating and a tin alloy plating onto the copper plating such that the circuit pattern is formed, wherein the circuit pattern forms a connecting terminal portion of the copper wiring, and comprises copper, and at least one selected from the group consisting of tin and a tin alloy;
contacting the photoresist, after the circuit pattern is formed, with a composition such that the photoresist is removed; and
removing an exposed copper layer after the photoresist is removed,
wherein the composition comprises
   2.5 to 30% by mass of an alkanolamine,
   0.5 to 4% by mass of a quaternary ammonium hydroxide,
   0.5 to 20% by mass of a sugar alcohol, each mass percent with respect to a total mass of the composition,
   1.5 to 8% by mass of a polar organic solvent comprising at least one selected from the group consisting of phenyl glycol and diethylene glycol monophenyl ether, and
   60% to 95% by mass water, and
   the composition does not substantially contain an azole compound.

2. A method for producing a semiconductor package, the method comprising:
   producing a package substrate by the method of claim 1;
   bringing together the package substrate and a semiconductor device such that connecting portions thereof are opposed to each other; and
   heating to a temperature at which at least one selected from the group consisting of tin and the tin alloy is melted, to thereby electrically connect the semiconductor device to the package substrate via at least one selected from the group consisting of tin and a tin alloy.

3. The method of claim 1, wherein the composition has an etching rate of at least one selected from the group consisting of tin and a tin alloy that is 0.1 μm/min or less at a temperature of 50° C.

4. The method of claim 1, wherein the water is present at 70% to 95% by mass with respect to the total mass of the composition.

5. The method of claim 1, wherein the polar organic solvent is present at 0.5 to 10% by mass with respect to the total mass of the composition.

6. The method of claim 1, wherein the sugar alcohol comprises at least one selected from the group consisting of sorbitol, xylitol, and mannitol.

7. The method of claim 1, wherein the quaternary ammonium hydroxide comprises at least one selected from the group consisting of tetramethylammonium hydroxide, tetraethylammonium hydroxide, and triethylmethylammonium hydroxide.

8. The method of claim 1, wherein the alkanolamine comprises at least one selected from the group consisting of 2-aminoethanol (monoethanolamine) and 1-amino-2-propanol.

9. A method for producing a semiconductor device having a copper wiring and a circuit pattern, the method comprising:

forming a barrier metal layer on an insulation layer at least partially having the copper wiring;

forming a copper layer on the barrier metal layer;

forming a dry film resist layer on the copper layer;

exposing the dry film resist layer;

developing the dry film resist layer such that a resist pattern comprising a photoresist is formed;

forming a copper plating on an opening of the resist pattern;

forming at least one selected from the group consisting of a tin plating and a tin alloy plating onto the copper plating such that the circuit pattern is formed, wherein the circuit pattern forms a connecting terminal portion of the copper wiring, and comprises copper, and at least one selected from the group consisting of tin and a tin alloy;

contacting the photoresist, after the circuit pattern is formed, with a composition such that the photoresist is removed; and removing an exposed copper layer after the photoresist is removed, wherein the composition comprises 2.5 to 30% by mass of an alkanolamine, 0.5 to 4% by mass of a quaternary ammonium hydroxide, 0.5 to 20% by mass of a sugar alcohol, each mass percent with respect to a total mass of the composition for removing a photoresist, 1.5 to 8% by mass of a polar organic solvent comprising at least one selected from the group consisting of phenyl glycol and diethylene glycol monophenyl ether, and 60% to 95% by mass water, and the composition does not substantially contain an azole compound.

10. A method for producing a semiconductor package, the method comprising:

producing a semiconductor device by the method of claim 9, bringing together a package substrate and the semiconductor device such that connecting portions thereof are opposed to each other; and heating to a temperature at which at least one selected from the group consisting of tin and the tin alloy is melted, to thereby electrically connect the semiconductor device to the package substrate via at least one selected from the group consisting of tin and a tin alloy.

11. The method of claim 9, wherein the composition for removing a photoresist has an etching rate of at least one selected from the group consisting of tin and a tin alloy that is 0.1 μm/min or less at a temperature of 50° C.

12. The method of claim 9, wherein the water is present in the composition for removing a photoresist at 70% to 95% by mass with respect to the total mass of the composition for removing a photoresist.

13. The method of claim 9, wherein the polar organic solvent is present at 0.5 to 10% by mass with respect to the total mass of the composition.

14. The method of claim 9, wherein the sugar alcohol comprises at least one selected from the group consisting of sorbitol, xylitol, and mannitol.

15. The method of claim 9, wherein the quaternary ammonium hydroxide comprises at least one selected from the group consisting of tetramethylammonium hydroxide, tetraethylammonium hydroxide, and triethylmethylammonium hydroxide.

16. The method of claim 9, wherein the alkanolamine comprises at least one selected from the group consisting of 2-aminoethanol (monoethanolamine) and 1-amino-2-propanol.

* * * * *